US009760025B2

(12) United States Patent
Wang et al.

(10) Patent No.: US 9,760,025 B2
(45) Date of Patent: Sep. 12, 2017

(54) RETICLE SHAPE REGULATION DEVICE AND METHOD, AND EXPOSURE APPARATUS USING SAME

(71) Applicant: SHANGHAI MICRO ELECTRONICS EQUIPMENT CO., LTD., Shanghai (CN)

(72) Inventors: Xinxin Wang, Shanghai (CN); Xuchu Jiang, Shanghai (CN); Wenjing Zhu, Shanghai (CN); Xiaogang Wang, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 34 days.

(21) Appl. No.: 14/900,073

(22) PCT Filed: Jun. 10, 2014

(86) PCT No.: PCT/CN2014/079602
§ 371 (c)(1),
(2) Date: Dec. 18, 2015

(87) PCT Pub. No.: WO2014/201963
PCT Pub. Date: Dec. 24, 2014

(65) Prior Publication Data
US 2016/0147163 A1 May 26, 2016

(30) Foreign Application Priority Data

Jun. 19, 2013 (CN) .......................... 2013 1 0245138

(51) Int. Cl.
*G03F 7/20* (2006.01)
(52) U.S. Cl.
CPC .......... *G03F 7/70783* (2013.01); *G03F 7/707* (2013.01); *G03F 7/708* (2013.01);
(Continued)

(58) Field of Classification Search
CPC .. G03F 7/707; G03F 7/70691; G03F 7/70733; G03F 7/708; G03F 7/70783; G03F 7/70866
See application file for complete search history.

(56) References Cited

FOREIGN PATENT DOCUMENTS

| CN | 8-318613 A | 12/1996 |
|---|---|---|
| CN | 101308805 A | 11/2008 |

(Continued)

*Primary Examiner* — Michelle M Iacoletti
(74) *Attorney, Agent, or Firm* — Muncy, Geissler, Olds & Lowe, P.C.

(57) ABSTRACT

A reticle shape regulation device includes: an adsorption device having an upper surface and a lower surface; and a limit mechanism having a limit surface. The adsorption device is movable relative to the limit mechanism at least in a vertical direction. The upper surface of the adsorption device faces toward and is engagable with the limit surface. The lower surface of the adsorption device defines a vacuum chamber that is configured for communication with a negative-pressure source so as to adsorb the reticle by a negative pressure. The lower surface of the adsorption device further defines at least one positive-pressure outlet that is in communication with a positive-pressure source and is configured to supply a continuous positive-pressure air flow between the lower surface of the adsorption device and the reticle during the adsorption of the reticle. The positive-pressure air flow is so controlled as to form an air cushion between the lower surface of the adsorption device and the reticle while allowing the adsorption of the reticle by the adsorption device. This can correct deformations of the reticle, thus enabling satisfactory flatness thereof during an exposure process, and can easily create vacuum and an air cushion between a deformed reticle and the adsorption device.

14 Claims, 4 Drawing Sheets

(52) U.S. Cl.
CPC ...... *G03F 7/70191* (2013.01); *G03F 7/70691* (2013.01); *G03F 7/70733* (2013.01); *G03F 7/70791* (2013.01); *G03F 7/70866* (2013.01)

(56) References Cited

FOREIGN PATENT DOCUMENTS

| | | |
|---|---|---|
| CN | 201236208 Y | 5/2009 |
| CN | 202421721 U | 9/2012 |
| JP | 7-335533 A | 12/1995 |

RETICLE SHAPE REGULATION DEVICE AND METHOD, AND EXPOSURE APPARATUS USING SAME

TECHNICAL FIELD

The present invention belongs to the field of photolithography and relates to a device and a method for regulating the shape of a reticle, in particular, a large reticle, and an exposure apparatus using the device and method.

BACKGROUND

Photolithography tools are mainly used in the manufacture of integrated circuits (ICs), flat panel displays and other micro devices. With a photolithography tool, distinct patterns formed in accurately-aligned respective reticles are successively transferred to a photoresist-coated wafer such as, for example, a semiconductor wafer or a wafer for forming a liquid crystal display (LCD). Photolithography tools are overall categorized into two types. A first type is called step-and-repeat systems (steppers), in which a reticle pattern is exposed onto an exposure area of a wafer in one shot, and the wafer is then moved relative to the reticle (or mask) to locate the next exposure area right under the reticle pattern interposed by a projection objective which helps to again expose the reticle pattern onto this another exposure area of the wafer. This process is repeated until an image of the reticle pattern is formed on all exposure areas of the wafer. The second type is called step-and-scan systems (scanners), whose exposure process is not completed by individual shots of the reticle pattern, but through a scan-and-image procedure facilitated by movement of the exposure field. During the exposure process of a scanner, the reticle and the wafer are simultaneously moved relative to the projection beam as well as the projection system, during which the reticle pattern is scanned over the entire exposure field on the wafer. All these photolithography systems need to employ suitable devices as respective carriers of the mask and wafer/substrate, which can make accurate relative movements, in order to meet the requirements of photolithography. The carriers of the mask are referred to as reticle stages and the carriers of the wafer/substrate are referred to as wafer stages.

The reticle stage of a scanner is generally consisted of a fine-motion stage and a coarse motion-stage, wherein the fine-motion stage is used for accomplishing fine and precision adjustments of the reticle and the coarse motion-stage is used for enabling large-stroke movements thereof required in the scanning exposure process, in which transferring the reticle within the photolithographic system is the most critical task, and the flatness (i.e., the deformation degree in the vertical Z direction) and positional accuracy of the reticle stage are factors that greatly determine the exposure quality.

In order to enhance the photolithography efficiency, some scanners, for example, those equipped with split lenses and used in the production of flat panel displays, expand the exposure field by the use of large reticles. For instances, the reticle size for Generation 4.5 (G4.5) to Generation 6 (G6) production lines is generally 520×610 mm or 520×800 mm, and that for production lines of the later generations is generally 850×1200 mm, 850×1400 mm, or larger. In addition, in line with their expanded areas, these reticles are generally made with a thickness of 8 mm. However, such large reticles tend to experience deformations when they are lifted by suction, causing horizontal irregularities and deviations in the Z direction, some of which are up to 50 µm in some cases. Serious deterioration in imaging performance will occur if such adverse impact is not properly controlled.

To address this problem, those skilled in this art have employed photoelectric detection systems to real-time measure the Z direction deviations of horizontal positions of reticles, thus can achieve real-time control of objective imaging plane using the measurements as inputs. However, this solution is complex and costly and imposes high requirements on the projection objective. An exposure apparatus has also been proposed which employs multiple sites for vacuum attraction of a reticle and for correcting a deformation of the reticle by adjusting the vacuum pressures. However, this apparatus is associated with the problem that, as the sites are in fixed positional relationship with respect to the reticle, the negative pressures cannot be attained if the deformation is too large and forms a great gap between the reticle and attraction sites.

SUMMARY OF THE INVENTION

The present invention provides a device and a method for regulating a shape of a reticle and an exposure apparatus using the device and method, which can correct deformations of the reticle and enable satisfactory flatness thereof during the exposure process, thereby ensuring good performance of the process.

In order to overcome the foregoing problem, the present invention provides a device for regulating a shape of a reticle, including: an adsorption device having an upper surface and a lower surface; and a limit mechanism having a limit surface, the adsorption device being movable relative to the limit mechanism at least in a vertical direction, the upper surface of the adsorption device facing toward and being engagable with the limit surface, wherein the lower surface of the adsorption device defines a vacuum chamber that is configured for communication with a negative-pressure source so as to adsorb the reticle by a negative pressure, and wherein the lower surface of the adsorption device further defines at least one positive-pressure outlet that is in communication with a positive-pressure source and is configured to supply a continuous positive-pressure air flow between the lower surface of the adsorption device and the reticle during the adsorption of the reticle, the positive-pressure air flow being so controlled as to form an air cushion between the lower surface of the adsorption device and the reticle while allowing the pick-up of the reticle by the adsorption device.

Optionally, the lower surface of the adsorption device may define a plurality of positive-pressure outlets arranged around the vacuum chamber.

Optionally, the adsorption device may include a pneumatic cylinder and a piston with one end located within the pneumatic cylinder and thereby separates the pneumatic cylinder into a positive-pressure pneumatic chamber and a negative-pressure pneumatic chamber and the other end in movable connection with the limit mechanism.

Additionally, the positive-pressure pneumatic chamber may be in communication with the positive-pressure source and configured to drive the upper surface of the adsorption device to approach the limit surface of the limit mechanism when the positive-pressure source is activated.

Additionally, the vacuum chamber may be in communication with the negative-pressure pneumatic chamber, and further with the negative-pressure source through the negative-pressure pneumatic chamber.

Additionally, the other end of the piston may be connected to the limit mechanism by a ball head link.

Additionally, a channel may extend through both the piston and ball head link, wherein the vacuum chamber is in communication with the negative-pressure pneumatic chamber, and both the vacuum chamber and the negative-pressure pneumatic chamber are in communication with the negative-pressure source via the channel.

Optionally, the reticle may have a size of 520×610 mm or larger.

The present invention also provides a method for regulating a shape of a reticle, for use in a device as defined above, including:

supplying a positive pressure to the positive-pressure pneumatic chamber to raise the adsorption device, and getting ready to receive an instruction;

upon receipt of the instruction, ceasing the supply of the positive pressure to the positive-pressure pneumatic chamber and supplying a negative pressure to the negative-pressure pneumatic chamber and a positive pressure to the at least one positive-pressure outlet;

the adsorption device moving down to a position closely above the reticle, where the reticle is picked up by the adsorption device and an air cushion is formed between the adsorption device and the reticle; and again supplying the positive-pressure pneumatic chamber with a positive pressure such that the adsorption device keeps moving upward while holding the reticle until the upper surface of the adsorption device is engaged with the limit surface.

The present invention further provides an exposure apparatus, including: at least one illumination device; at least one objective lens, disposed under the at least one illumination device; a reticle stage, arranged between the at least one illumination device and the at least one objective lens and configured to carry a reticle; a substrate stage, disposed under the at least one objective lens and configured to carry a substrate, the at least one illumination device and the at least one objective lens cooperate to transfer a pattern in the reticle onto the substrate; and at least one reticle shape regulation device disposed above the reticle stage and each of the at least one reticle shape regulation device including: an adsorption device having an upper surface and a lower surface; and a limit mechanism having a limit surface, the adsorption device being movable relative to the limit mechanism at least in a vertical direction, the upper surface of the adsorption device facing toward and being engagable with the limit surface, wherein the lower surface of the adsorption device of the at least one reticle shape regulation device defines a vacuum chamber that is configured for communication with a negative-pressure source so as to adsorb the reticle by a negative pressure, wherein a position of the at least one reticle shape regulation device is configured such that at least a portion of a surface of the reticle is flat upon engagement of the upper surface of the adsorption device with the limit surface of the limit mechanism of each of the at least one reticle shape regulation device, and wherein the lower surface of the adsorption device of each of the at least one reticle shape regulation device further defines at least one positive-pressure outlet that is in communication with a positive-pressure source and is configured to supply a continuous positive-pressure air flow between the lower surface of the adsorption device and the reticle during the adsorption of the reticle, the positive-pressure air flow being so controlled as to form an air cushion between the lower surface of the adsorption device and the reticle while allowing the pick-up of the reticle by the adsorption device.

Optionally, the exposure apparatus may include a plurality of illumination devices and a plurality of objective lens, wherein the plurality of illumination devices are arranged at intervals along a horizontal direction, and the plurality of objective lens are disposed under the plurality of illumination devices and cooperate therewith to transfer the pattern in the reticle onto the substrate.

Optionally, each of the at least one reticle shape regulation device may be arranged in the horizontal direction between adjacent two of the plurality of illumination devices Optionally, the at least a portion of the surface of the reticle may include the portion of the surface of the reticle located under the at least one illumination device.

The present invention is advantageous over the prior art in that it can correct deformations of the reticle, thus enabling satisfactory flatness thereof during the exposure process, and can easily create vacuum and an air cushion between a deformed reticle and the adsorption device.

In these figures: 100-reticle shape regulation device, 110-adsorption device, 111-vacuum chamber, 112-positive-pressure channel, 113-first channel, 120-pneumatic cylinder, 121-negative-pressure pneumatic chamber, 122-positive-pressure pneumatic chamber, 123-piston, 130-ball head link, 131-second channel, 140-air cushion, 150-upper surface, 160-lower surface, 200-limit mechanism, 210-limit surface, 300-illumination system, 400-reticle stage, 500-split objective lens, 600-substrate stage, 700-reticle, 800-field of illumination, and 900-substrate.

DETAILED DESCRIPTION

The above purposes, features and advantages of the present invention will become more apparent from the following description which is to be read in connection with the accompanying drawings. Note that the accompanying drawings are provided in a very simplified form not necessarily presented to scale, with the only purpose for convenience and clarity in explaining several specific embodiments of the invention.

Figure 1:
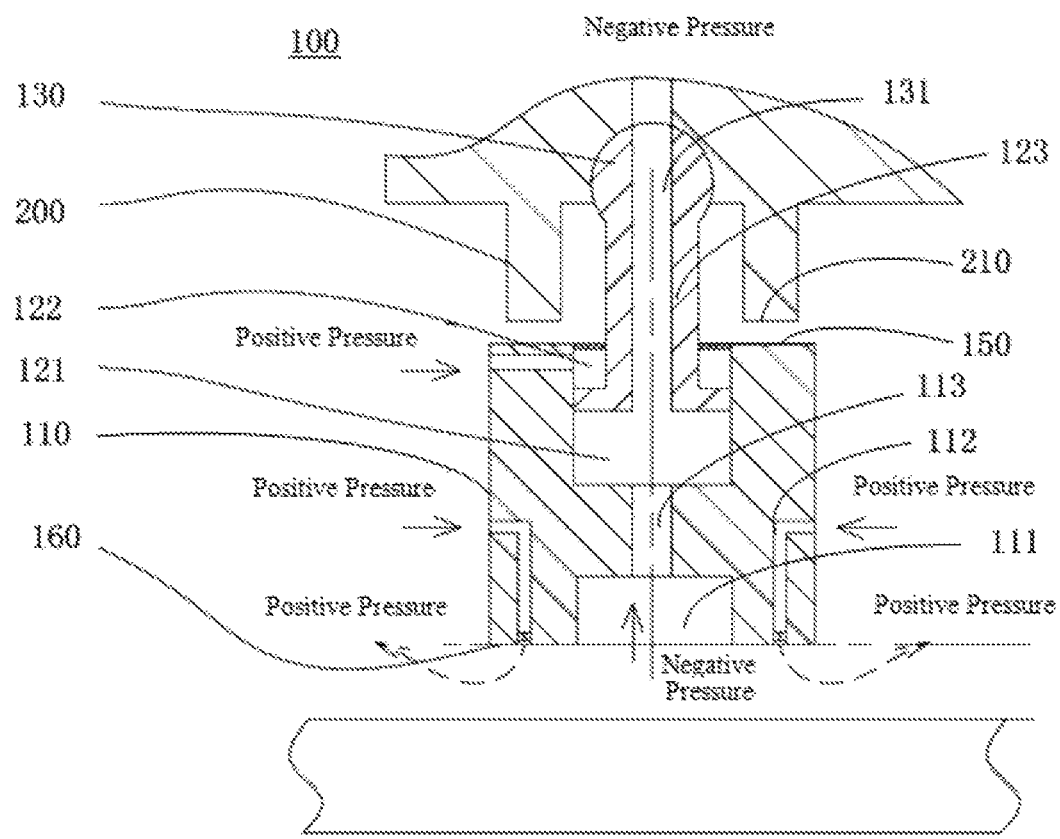
FIG. 1 is a schematic diagram of a device for regulating the shape of a reticle in accordance with an embodiment of the present invention.
Figure 5:
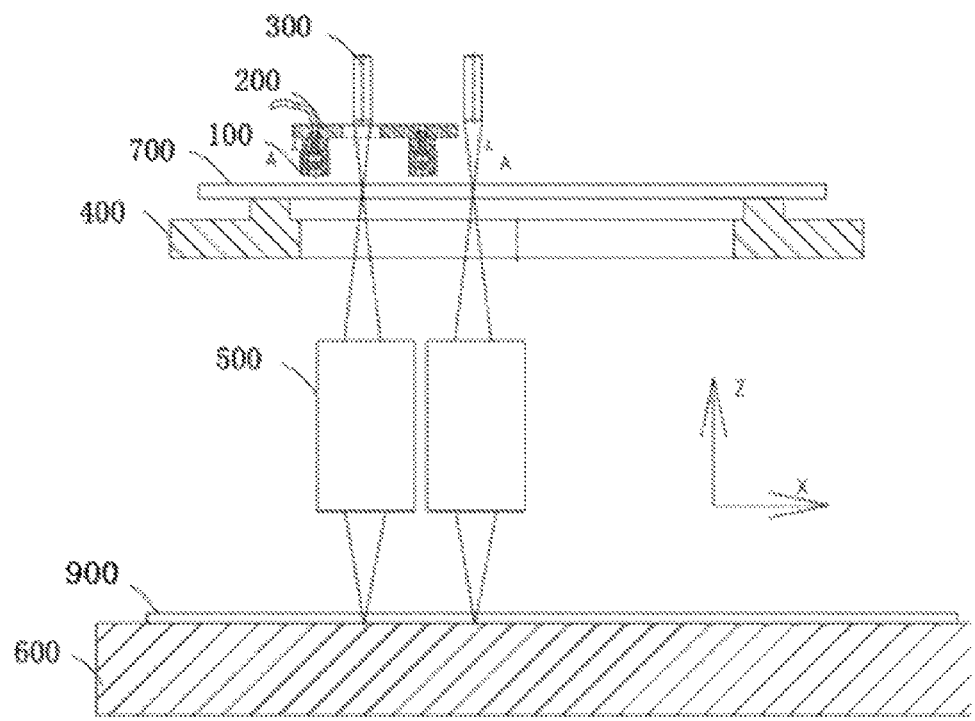
FIG. 5 is a schematic diagram of a split-lens type exposure apparatus in accordance with an embodiment of the present invention.

FIG. 1 shows a reticle shape regulation device 100 of the present invention. Referring to FIG. 1, in conjunction with FIGS. 2 to 3, the device includes an adsorption device 110 having an upper surface 150 and a lower surface 160. A pneumatic cylinder 120 is disposed within the adsorption device 110, and a piston 123 has one end located within the pneumatic cylinder 120 and the other end in movable connection with the limit mechanism 200 via a ball head link 130. The end of the piston 123 located in the pneumatic cylinder separates the pneumatic cylinder 120 into a positive-pressure pneumatic chamber 122 and a negative-pressure pneumatic chamber 121. A vacuum chamber 111 is formed in the bottom of the adsorption device 110 and the vacuum chamber 111 is able to communicate with the negative-pressure pneumatic chamber 121 via a first channel 113. Specifically, the positive-pressure pneumatic chamber 122 may be connected to an external positive-pressure source and a positive pressure can be provided to the positive-pressure pneumatic chamber 122. Additionally, a negative pressure can be provided to the negative-pressure pneumatic chamber 121 via the vacuum chamber 111. The provision of the positive pressure to the positive-pressure pneumatic chamber 122 will lift the adsorption device 110 up, thereby allowing a reticle 700 to be placed on a reticle stage 400 (FIG. 5).

Figure 2:
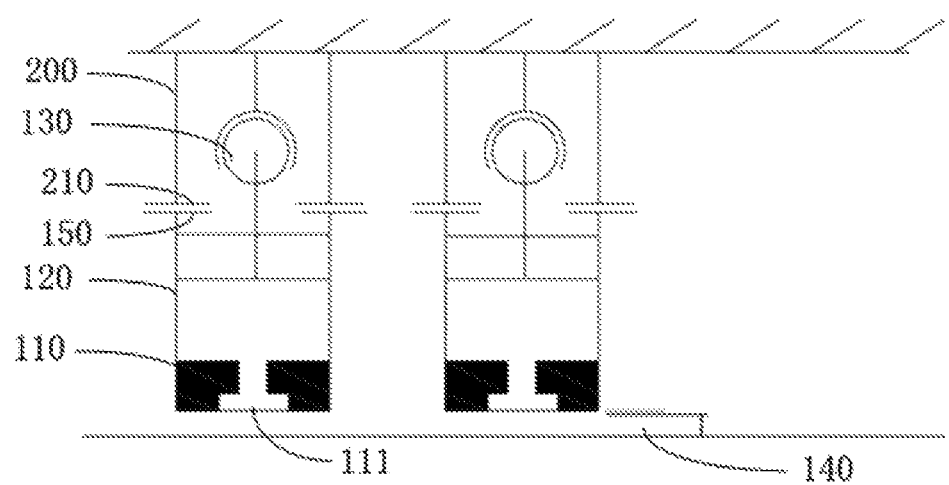
FIG. 2 is a diagram illustrating how a device for regulating the shape of a reticle in accordance with an embodiment of the present invention works (when there is no need for reticle shape regulation).
Figure 3:
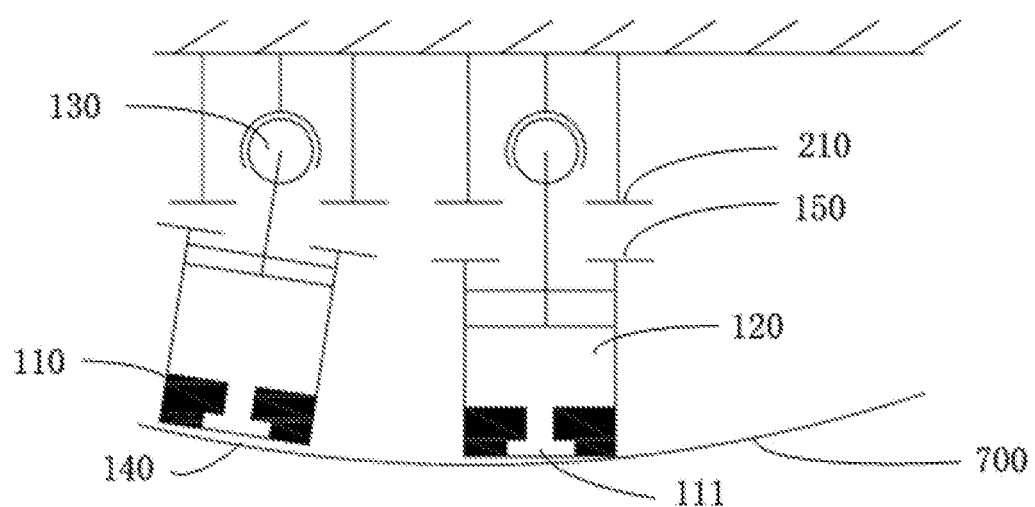
FIG. 3 is a diagram illustrating how a device for regulating the shape of a reticle in accordance with an embodiment of the present invention works (when there is a need for reticle shape regulation).

With continued reference to FIGS. 1 to 3, around the vacuum chamber 111 are arranged positive-pressure channels 112. Each of the positive-pressure channels 112 has an inlet on a lateral surface of the adsorption device 110 and an outlet on the lower surface 160 of the adsorption device 110. The inlets of the positive-pressure channels 112 can be connected to the same external positive-pressure source as the positive-pressure pneumatic chamber 122, but the two are provided with different valves for individual control of positive pressures supplied to them. Alternatively, the inlets of the positive-pressure channels 112 can also be connected to another positive-pressure source than that of the positive-pressure pneumatic chamber 122 in order to obtain more independence in getting the positive pressure. When the supply of the positive pressure to the positive-pressure pneumatic chamber 122 is cut off, a negative pressure is provided to the negative-pressure pneumatic chamber 121. Concurrently, a positive pressure is provided to the inlets of the positive-pressure channels 112 and results in a positive-pressure air flow discharged from the outlets of the positive-pressure channels 112. As a result, both the pneumatic cylinder 120 and adsorption device 110 move downward due to their gravity and a distance between the adsorption device 110 and the reticle 700 is gradually decreased, which facilitates the creation of vacuum and an air cushion. When the adsorption device 110 gets very close to the reticle 700 and nearly comes into contact with the reticle 700, adsorption device the positive-pressure channels 112, the negative-pressure pneumatic chamber 121 and the vacuum chamber 111 cooperate such that an air cushion 140 is formed between the adsorption device 110 and the reticle 700, thus preventing the direct contact between the adsorption device 110 and reticle 700. On the other hand, as the adsorption device 110 is in close proximity to the reticle 700, the vacuum chamber 111 creates a vacuum between the adsorption device 110 and the reticle 700, and thereby enables the adsorption device 100 to pick up the reticle 700. Therefore, the reticle shape regulation device 100 according to the present invention can lift up the reticle 700 with certain connection stiffness while ensuring that there is no horizontal friction occurring between the adsorption device 110 and the reticle 700.

In case of the reticle 700 undergoing deformation, the connection between the adsorption device 110 and the limit mechanism 200 via the ball head link 130 allows the reticle shape regulation device 100 to pivot in response to the deforming direction of the reticle surface and to thereby create vacuum and pick up the reticle 700 in a more favorable manner.

Preferably, with continued reference to FIG. 1, the ball head link 130 defines a second channel 131 extending along its center line and connecting the negative-pressure pneumatic chamber 121 and the limit mechanism 200. In other words, the second channel 131 acts as a negative pressure inlet for the vacuum chamber 111 as well as the negative-pressure pneumatic chamber 121, and is in connection with an external negative-pressure source.

Figure 4:
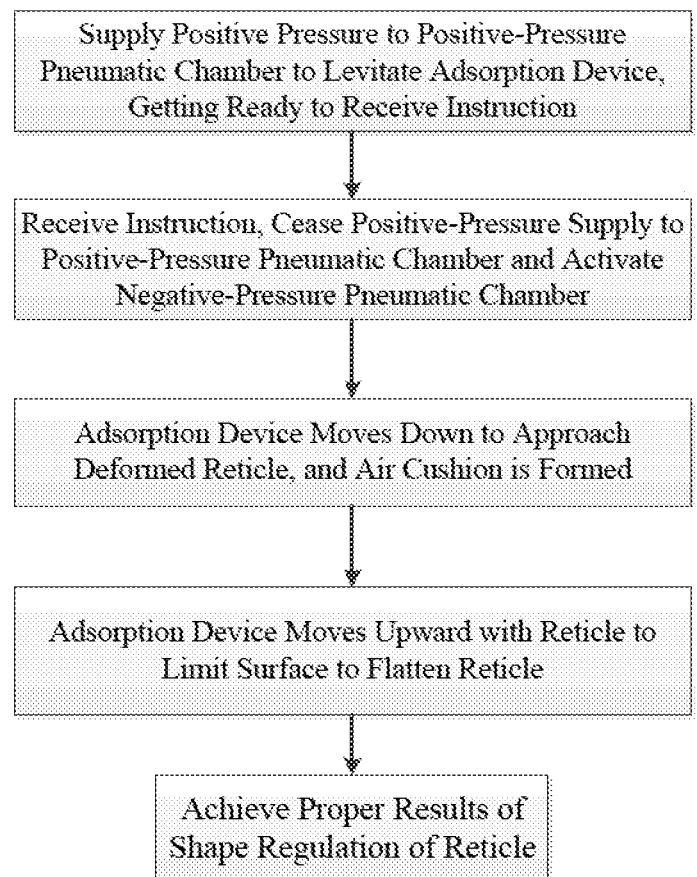
FIG. 4 depicts a flowchart illustrating the work flow of a device for regulating the shape of a reticle in accordance with an embodiment of the present invention.

Referring to FIG. 4, in conjunction with FIGS. 1 to 3, as well as FIGS. 5 to 6, the present invention also provides a method for regulating the shape of a reticle, used in conjunction with the above-described device 100, the method including the steps described below.

If there is no reticle 700 loaded on the reticle stage 400, a positive pressure is supplied to the positive-pressure pneumatic chamber 122 to drive the reticle shape regulation device 100 to a levitated position where the device is ready for receiving an instruction from the photolithography equipment in which the device is deployed.

Once the instruction has been received, the provision of the positive pressure to the positive-pressure pneumatic chamber 122 is ceased, followed by supplying the negative-pressure pneumatic chamber 121 with a negative pressure. More specifically, with a reticle 700 having been positioned on the reticle stage 400, the photolithography equipment may send the instruction to the reticle shape regulation device 100. After the device 100 has received the instruction, the supply of the positive pressure to the positive-pressure pneumatic chamber 122 is stopped, and a negative pressure is provided to both of the negative-pressure pneumatic chamber 121 and the vacuum chamber 111, and concurrently a positive pressure to the inlets of the positive-pressure channels 112. Upon generation of a vacuum pressure in the adsorption device 110, the negative-pressure pneumatic chamber 121 comes in communication with the vacuum chamber 111.

Afterward, the adsorption device 110 goes downward under the action of its own gravity to a position where the adsorption device 110 is in very close vicinity of the reticle 700 such that an air cushion 140 formed between the adsorption device 110 and the reticle 700 prevents the direct contact between the adsorption device 110 and the reticle 700, while the creation of vacuum by the vacuum chamber 111 enables the adsorption device 110 to pick the reticle 700 up. At this time, a negative pressure is generated in the adsorption device 110, rendering the negative-pressure pneumatic chamber 121 in communication with the vacuum chamber 111. With this completed, a positive pressure is again supplied to the positive-pressure pneumatic chamber 122 to drive the pneumatic cylinder 120 to move upward with the reticle 700 until the upper surface 150 of the adsorption device 110 comes in engagement with the limit surface 210 of the limit mechanism 200. As a result, the adsorption device 110 obtains bidirectional stiffness in the vertical direction, which allows the pick-up of the reticle 700 while ensuring none contact between the reticle 700 and adsorption device 110, so that the horizontal movement of the reticle 700 will not be affected when the reticle is carried by and moved along with the reticle stage 400. Preferably, a vertical position of the limit surface 210 may be adjustable so as to allow the adsorption device 110 to be raised to a level where the levitated reticle 700 keeps its surface horizontally flat, thereby correcting any possible deformation of the reticle 700. Therefore, this simple design enables shape regulation of a reticle 700 even with considerable deformation simply by levitating it with the adsorption device 110.

In practical applications, the above steps may be repeated to achieve proper results of the shape regulation of the reticle 700.

As noted above, the device and method according to the present invention can effectively address the problem of deformed reticles, particularly those with a large size. An example is presented below for illustrating the use of the inventive device and method in a scanner employing a large reticle.

Figure 6:
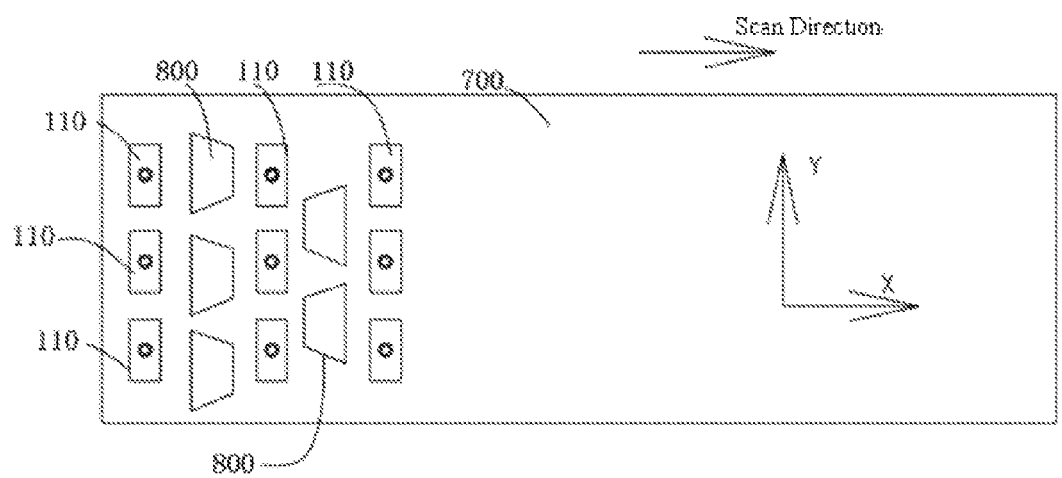
FIG. 6 is a cross-sectional view taken along line A-A in FIG. 5.

Referring to FIGS. 5 to 6, in conjunction with FIGS. 1 to 3, the present invention also relates to a split-lens type exposure apparatus, including: the reticle shape regulation device 100 (including the adsorption device 110 and the limit mechanism 200), an illumination system 300, a reticle stage 400, a split objective lens 500 and a substrate stage 600. The adsorption device 110 is configured to pick up a reticle and to engage the limit surface 210 of the limit mechanism 200. The limit surface 210 is configured between the illumination system 300 and the reticle stage 400. The split objective lens 500 is disposed between the reticle stage 400 and the substrate stage 600, and corresponds to the illumination system 300 in terms of vertical position. Specifically, the illumination system 300 serves as a light source for the exposure apparatus, and the reticle stage 400 is configured to support and position the reticle 700. The split objective lens 500 is made up of multiple lens elements to provide a large exposure field. The substrate stage 600 is configured to carry a substrate 900 and provides the substrate with the supporting and positioning functions. In addition, the split-lens type exposure apparatus according to the present invention features a small object distance and compatibility with the size of the reticle 700.

With continued reference to FIGS. 1 to 6, the exposure apparatus includes a plurality of the illumination systems 300 and a plurality of the split objective lenses 500, wherein the plurality of the illumination systems 300 and split objective lenses 500 are arranged staggered with respect to the reticle shape regulation devices 100. FIG. 6 particularly shows the positions of the split objective lenses (reflected by the fields of illumination 800 of the light source 300 in the figure) and the positions of the adsorption devices 110. Such staggered arrangement stitches the individual exposure fields of the plurality of lens elements into a large exposure field which enables the exposure of the pattern on the large reticle 700 onto the substrate stage 600. The adsorption devices 110 are so disposed as to regulate any possible deformation of the reticle 700 while not affecting the exposure field.

Preferably, as shown in FIG. 6, the plurality of the illumination systems 300 may be arranged in multiple rows along the horizontal X direction. The positions of the illumination systems 300 are shown as the multiple rows of the fields of illumination 800, wherein the numbers of the illumination systems 300 in the individual rows, i.e., the numbers of the illumination systems 300 along the horizontal Y direction, may be identical or not. In order to ensure a favorable exposure effect, at least a portion of the reticle located within the fields of illumination 800 of the illumination systems 300 must be kept flat. To this end, at least one reticle shape regulation device 100 must be deployed on each side of each row of the illumination systems 300. The number and position of the at least one device 100 may be adjustable to meet practical needs rather than being limited herein in any way. In addition, one or more reticle shape regulation devices 100 may also be arranged at position(s) distant from the illumination systems 300 and split objective lenses 500. Alternatively, there may also be no reticle shape regulation device 100 disposed at the position(s) in order to result in a simpler design. This is because surface irregularities of the reticle 700 at such position(s) do not have any impact on the exposure process.

While the reticle shape regulation device according to the present invention is shown in FIGS. 5 and 6 as being used in a step-and-scan photolithography system incorporating split objective lenses and using a large reticle, the present invention is not limited in this regard as the device may also be used to regulate the shape of small- or medium-size reticles to improve exposure quality. Further, the reticle shape regulation device can also be used in exposure apparatus not equipped with any split objective lens.

In summary, in the course of lifting up a reticle, the device according to the present invention provides a continuous positive-pressure air flow between the reticle and the lower surface of an adsorption device to form therebetween an air cushion. This allows the adsorption device to pick up the reticle while not coming in touch therewith, thereby ensuring that there will be no friction between the adsorption device and the reticle when the reticle is horizontally moved. In addition, the lift-up of the reticle is conducted on a portion thereof located within an exposure field, which results in a flat surface of the portion during the process and effectively corrects any possible large deformation that occurred under the action of the gravity of the reticle. The improved surface flatness of the reticle during the exposure process can enhance the exposure quality.

It is apparent that those skilled in the art can make various modifications and variations to the present invention without departing from the spirit and scope of the invention. Accordingly, it is intended that the present invention embraces all such modifications and variations as fall within the scope of the appended claims and equivalents thereof.

What is claimed is:

1. A device for regulating a shape of a reticle, comprising:
an adsorption device having an upper surface and a lower surface; and
a limit mechanism having a limit surface, the adsorption device being movable relative to the limit mechanism at least in a vertical direction, the upper surface of the adsorption device facing toward and being engagable with the limit surface,
wherein the lower surface of the adsorption device defines a vacuum chamber that is configured for communication with a negative-pressure source so as to adsorb the reticle by a negative pressure,
and wherein the lower surface of the adsorption device further defines at least one positive-pressure outlet that is in communication with a positive-pressure source and is configured to supply a continuous positive-pressure air flow between the lower surface of the adsorption device and the reticle during the adsorption of the reticle, the positive-pressure air flow being so controlled as to form an air cushion between the lower surface of the adsorption device and the reticle while allowing pick-up of the reticle by the adsorption device.

2. The device according to claim 1, wherein the lower surface of the adsorption device defines a plurality of positive-pressure outlets arranged around the vacuum chamber.

3. The device according to claim 1, wherein the adsorption device comprises a pneumatic cylinder and a piston with one end located within the pneumatic cylinder and thereby separates the pneumatic cylinder into a positive-pressure pneumatic chamber and a negative-pressure pneumatic chamber and the other end in movable connection with the limit mechanism.

4. The device according to claim 3, wherein the positive-pressure pneumatic chamber is in communication with the positive-pressure source and is configured to drive the upper surface of the adsorption device to approach the limit surface of the limit mechanism when the positive-pressure source is activated.

5. The device according to claim 3, wherein the vacuum chamber is in communication with the negative-pressure pneumatic chamber, and further with the negative-pressure source through the negative-pressure pneumatic chamber.

6. The device according to claim 3, wherein the other end of the piston is connected to the limit mechanism by a ball head link.

7. The device according to claim 6, wherein a channel extends through both the piston and ball head link, and wherein the vacuum chamber is in communication with the negative-pressure pneumatic chamber, and both the vacuum chamber and the negative-pressure pneumatic chamber are in communication with the negative-pressure source via the channel.

8. The device according to claim 1, wherein the reticle has a size of 520×610 mm or larger.

9. A method for regulating a shape of a reticle, for use in a device as defined in claim 3, comprising:
supplying a positive pressure to the positive-pressure pneumatic chamber to raise the adsorption device;
upon receipt of an instruction, ceasing the supply of the positive pressure to the positive-pressure pneumatic chamber and supplying a negative pressure to the negative-pressure pneumatic chamber and a positive pressure to the at least one positive-pressure outlet;
the adsorption device moving down to a position closely above the reticle, where the reticle is picked up by the adsorption device and an air cushion is formed between the adsorption device and the reticle; and
again supplying the positive-pressure pneumatic chamber with a positive pressure such that the adsorption device keeps moving upward while holding the reticle until the upper surface of the adsorption device is engaged with the limit surface.

10. An exposure apparatus, comprising:
at least one illumination device;
at least one objective lens, disposed under the at least one illumination device;
a reticle stage, arranged between the at least one illumination device and the at least one objective lens and configured to carry a reticle;
a substrate stage, disposed under the at least one objective lens and configured to carry a substrate, the at least one illumination device and the at least one objective lens cooperate to transfer a pattern in the reticle onto the substrate; and
at least one reticle shape regulation device disposed above the reticle stage and each of the at least one reticle shape regulation device comprising:
an adsorption device having an upper surface and a lower surface; and
a limit mechanism having a limit surface, the adsorption device being movable relative to the limit mechanism at least in a vertical direction, the upper surface of the adsorption device facing toward and being engagable with the limit surface,
wherein the lower surface of the adsorption device of the at least one reticle shape regulation device defines a vacuum chamber that is configured for communication with a negative-pressure source so as to adsorb the reticle by a negative pressure,
wherein a position of the at least one reticle shape regulation device is configured such that at least a portion of a surface of the reticle is flat upon engagement of the upper surface of the adsorption device with the limit surface of the limit mechanism of each of the at least one reticle shape regulation device,
and wherein the lower surface of the adsorption device of each of the at least one reticle shape regulation device further defines at least one positive-pressure outlet that is in communication with a positive-pressure source and is configured to supply a continuous positive-pressure air flow between the lower surface of the adsorption device and the reticle during the adsorption of the reticle, the positive-pressure air flow being so controlled as to form an air cushion between the lower surface of the adsorption device and the reticle while allowing pick-up of the reticle by the adsorption device.

11. The exposure apparatus according to claim 10, wherein the exposure apparatus comprises a plurality of illumination devices and a plurality of objective lens, wherein the plurality of illumination devices are arranged at intervals along a horizontal direction, and wherein the plurality of objective lens are disposed under the plurality of illumination devices and cooperate therewith to transfer the pattern in the reticle onto the substrate.

12. The exposure apparatus according to claim 11, wherein each of the at least one reticle shape regulation device is arranged in the horizontal direction between adjacent two of the plurality of illumination devices.

13. The exposure apparatus according to claim 10, wherein the reticle has a size of 520×610 mm or larger.

14. The exposure apparatus according to claim 10, wherein the at least a portion of the surface of the reticle comprises a portion of the surface of the reticle located under the at least one illumination device.

* * * * *